United States Patent
Nakamura et al.

(10) Patent No.: US 7,859,110 B2
(45) Date of Patent: Dec. 28, 2010

(54) SOLDER RESIST MATERIAL, WIRING BOARD USING THE SOLDER RESIST MATERIAL, AND SEMICONDUCTOR PACKAGE

(75) Inventors: Kensuke Nakamura, Tokyo (JP); Hiroshi Hirose, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 104 days.

(21) Appl. No.: 12/298,706

(22) PCT Filed: Apr. 26, 2007

(86) PCT No.: PCT/JP2007/059420

§ 371 (c)(1),
(2), (4) Date: Dec. 2, 2008

(87) PCT Pub. No.: WO2007/126130

PCT Pub. Date: Nov. 8, 2007

(65) Prior Publication Data

US 2009/0218672 A1    Sep. 3, 2009

(30) Foreign Application Priority Data

Apr. 28, 2006   (JP) ............................... 2006-125327
Apr. 3, 2007    (JP) ............................... 2007-097547

(51) Int. Cl.
*H01L 21/00* (2006.01)

(52) U.S. Cl. ............................ 257/756; 257/E21.586; 257/E21.596; 257/E23.185

(58) Field of Classification Search ......... 257/697–756, 257/E21.538, 596, 626, 23.185, 198
See application file for complete search history.

(56) References Cited

U.S. PATENT DOCUMENTS

| 4,833,226 | A  | * | 5/1989  | Ishimura et al. ............... 528/45 |
| 6,605,353 | B2 | * | 8/2003  | Okada et al. ................. 428/413 |
| 6,835,785 | B2 | * | 12/2004 | Ishii et al. ................... 525/391 |
| 7,396,588 | B2 | * | 7/2008  | Wakizaka et al. ........... 428/332 |
| 2001/0056174 | A1 | * | 12/2001 | Okada et al. ................. 528/310 |
| 2004/0234741 | A1 | * | 11/2004 | Hosomi et al. ........... 428/292.1 |
| 2008/0033117 | A1 | * | 2/2008  | Ishii et al. ................... 525/391 |
| 2009/0205856 | A1 | * | 8/2009  | Ishii et al. ................... 174/258 |
| 2009/0266583 | A1 | * | 10/2009 | Nagasaki et al. ........... 174/250 |
| 2010/0048826 | A1 | * | 2/2010  | Ishii et al. ................... 525/396 |
| 2010/0078201 | A1 | * | 4/2010  | Yoshizaki et al. ........... 174/255 |
| 2010/0101843 | A1 | * | 4/2010  | Wakabayashi et al. ...... 174/258 |

FOREIGN PATENT DOCUMENTS

| JP | 04-221883  | 8/1992  |
| JP | 2003-101244 | 4/2003 |
| JP | 2004-356199 | 12/2004 |
| JP | 2004-356200 | 12/2004 |

* cited by examiner

*Primary Examiner*—Michael S Lebentritt
(74) *Attorney, Agent, or Firm*—Ditthavong Mori & Steiner, P.C.

(57) ABSTRACT

The present invention provides a solder resist material, which can suppress the warpage of a semiconductor package upon exposure to heat or impact even when used in a thin wiring board and meets a demand for size reduction in electronic devices and a higher level of integration, and a wiring board comprising the solder resist material and a semiconductor package. The solder resist material of the present invention can effectively suppress the warpage of a semiconductor package through a fiber base material-containing layer interposed between resin layers. The fiber base material-containing layer is preferably unevenly distributed in the thickness direction of the solder resist material.

12 Claims, 2 Drawing Sheets

SOLDER RESIST MATERIAL, WIRING BOARD USING THE SOLDER RESIST MATERIAL, AND SEMICONDUCTOR PACKAGE

TECHNICAL FIELD

The present invention relates to a solder resist material, a wiring board using the same and a semiconductor package.

BACKGROUND ART

Recently, reduction in size and weight of electronic devices and their high functionality have been rapidly improved. Size reduction and higher level of integration of semiconductor integrated circuits used in such electronic devices have also been improved. For this reason, there is a dilemma in that, though the number of wiring pins of an integrated circuit is more increased compared to that of a conventional semiconductor package, a mounting area and a package area are decreased. Under such circumstances, packaging methods having a high package density, such as BGA (Ball Grid Array) method and CSP (Chip Scale Package) method, which are different from conventional package methods, have been proposed.

In these semiconductor package methods, instead of a lead frame used for conventional semiconductor packages, a wiring board for mounting a semiconductor chip, which is constituted by various materials such as plastics and ceramics (e.g., a substrate and an interposer), is used, and thereby an electrode of a semiconductor chip and a wiring board are electrically connected. A circuit constituted on the wiring board for mounting the semiconductor chip is introduced into an electronic device that is reduced in size and thickness and is highly densified. Therefore, compared to general wiring boards, the wiring board is much thinner, and its wiring is significantly advanced in terms of thinning and density growth. In such a package method, when an electrode of a semiconductor chip and a wiring board are electrically connected, fine wires are connected to them under high-temperature atmosphere by means of solder reflow or the like. The fine wiring must be protected. As a protective layer therefor, solder resist materials having various resin compositions have been developed.

In general, a pore portion for mounting a semiconductor chip, an electronic part or the like is formed in a solder resist. For example, a pore portion of a solder resist is laminated with a photomask in which a pattern is formed, and it is subjected to exposure according to the photographic method and subsequently subjected to image development using a developer such as sodium carbonate, sodium hydroxide and tetramethyl ammonium hydride (TMAH) to form a pore portion. However, as electronic devices are further reduced in size and thickness, miniaturization of wiring is further accelerated. For this reason, the ratio of a solder resist layer with respect to the thickness of a wiring board tends to be increased. Therefore, since a solder resist in which a pore portion is formed by exposure/development has a low glass transition temperature, a low elastic modulus and a high coefficient of thermal expansion, a solder resist material having physical properties, which are more similar to those of an insulation layer of a wiring board, is desired.

When using the photographic method, it is difficult to form a fine pore portion due to influence of scattered light, and for this reason, attention has been given to methods of opening a pore by means of laser irradiation (for example, see Japanese Laid-Open Patent Publication No. 2003-101244 (Patent Document 1)). However, when using a conventional photosensitive resin for a solder resist in which a pore is opened by means of laser irradiation, since a thermosetting resin such as epoxy resin is used as the photosensitive resin, accuracy of opening a pore by means of laser irradiation may be low depending on a resin composition thereof. In addition, since a temperature of solder reflow is increased in the mounting process as a solder becomes lead-free, a crack may be generated at the time of heating particularly in the case of using a thin wiring board.

DISCLOSURE OF THE INVENTION

Under the above-described circumstances, in order to meet the demand for reduction in size and weight of electronic devices and their high functionality, solder resist materials, which can effectively suppress the warpage of a package even when used in a thin wiring board, are desired. In particular, improvement of low coefficient of thermal expansion, high elastic modulus, heat resistance, reliability of thermal shock properties and the like of solder resist materials is desired.

One of the purposes of the present invention is to provide a solder resist material, which can suppress the warpage of a package. Another purpose of the present invention is to provide a solder resist material, which has a low coefficient of thermal expansion and a high elastic modulus and is excellent in heat resistance and reliability of thermal shock properties, and which may have a favorable microscopical pore formed by means of laser irradiation. Another purpose of the present invention is to provide a wiring board, in particular, a thin wiring board, which is excellent in low coefficient of thermal expansion, heat resistance, reliability of thermal shock properties and the like.

That is, the present invention provides the following solder resist material, wiring board, etc.

[1] A solder resist material comprising at least a first resin layer, a second resin layer and a fiber base material-containing layer, wherein the fiber base material-containing layer is interposed between the first resin layer and the second resin layer.

[2] The solder resist material according to item [1], wherein the fiber base material-containing layer is unevenly distributed in the thickness direction of the solder resist material.

[3] The solder resist material according to item [1] or [2], wherein the ratio between the thickness (B1) of the first resin layer and the thickness (B2) of the second resin layer (B2/B1) satisfies $0 < B2/B1 \leq 1$.

[4] The solder resist material according to any one of items [1] to [3], wherein a fiber base material included in the fiber base material-containing layer is selected from a glass fiber base material and an organic fiber base material. The glass fiber base material to be used in the solder resist material of the present invention is preferably treated with an epoxysilane-based coupling agent.

[5] The solder resist material according to any one of items [1] to [4], wherein the fiber base material included in the fiber base material-containing layer is a glass fiber base material having a coefficient of thermal expansion (CTE) of 6 ppm or less.

[6] The solder resist material according to any one of items [1] to [5], wherein a resin composition constituting the first resin layer and the second resin layer comprises: a cyanate resin and/or a prepolymer thereof; an epoxy resin which does not substantially contain a halogen atom; a phenoxy resin which does not substantially contain a halogen atom; and an imidazole compound. The cyanate resin to be used in the solder resist material of the present invention is preferably a novolac type cyanate resin. The epoxy resin is preferably an arylalkylene type epoxy resin. The imidazole compound preferably has 2 or more functional groups selected from an aliphatic hydrocarbon group, an aromatic hydrocarbon group, a hydroxyalkyl group and a cyanoalkyl group.

[7] The solder resist material according to any one of items [1] to [6], wherein the amount of Na ion or Cl ion contained in the solder resist material is 10 ppm or less.

[8] The solder resist material according to any one of items [1] to [7], wherein the solder resist material further comprises a pigment. The pigment to be used in the solder resist material of the present invention is preferably a green pigment. The content of a pigment component in the green pigment is preferably 0.01 to 5 wt % of the total weight of a resin composition.

[9] The solder resist material according to item [8], wherein the pigment is a pigment in which the weight ratio of a halogen-free yellow pigment and/or a halogen-free orange pigment to a halogen-free blue pigment is in the range of 1:10 to 10:1.

[10] The solder resist material according to item [9], wherein the halogen-free yellow pigment is benzimidazolone yellow and the halogen-free blue pigment is copper phthalocyanine blue.

[11] A solder resist material, wherein a glass fiber base material is contained in a resin composition comprising: a cyanate resin and/or a prepolymer thereof; an epoxy resin which does not substantially contain a halogen atom; a phenoxy resin which does not substantially contain a halogen atom; and an imidazole compound.

[12] A wiring board to which a solder resist layer made of the solder resist material according to any one of items [1] to [11] is provided.

[13] The wiring board according to item [12], wherein a pore portion of the solder resist layer is provided by means of laser irradiation. The laser to be used for the wiring board of the present invention is preferably a carbon dioxide gas laser, a third-harmonic wave UV-YAG laser, a fourth-harmonic wave UV-YAG laser or an excimer laser.

[14] A semiconductor package having the wiring board according to item [12] or [13].

The present invention provides a solder resist material, which has at least a first resin layer, a second resin layer and a fiber base material-containing layer, wherein the fiber base material-containing layer is interposed between the first resin layer and the second resin layer. Since the fiber base material-containing layer is interposed between the first resin layer and the second resin layer in the solder resist material of the present invention, it can realize significantly low coefficient of thermal expansion and high elastic modulus compared to a solder resist made of a thermosetting resin or a photosensitive resin which does not comprise a fiber base material-containing layer. By providing the solder resist layer made of the solder resist material of the present invention to the wiring board, the warpage of a package can be suppressed, and reliability for thermal shock such as thermal cycle can be improved.

In a preferred embodiment of the present invention, the fiber base material-containing layer is unevenly distributed in the thickness direction of the solder resist material. When a required amount of resin varies depending on the circuit pattern of an inner layer, the resin may stick out, or may be insufficient for embedding the circuit. Even in such cases, the solder resist material of the present invention can sufficiently embed the circuit when changing the position of the fiber base material-containing layer in the thickness direction and suitably adjusting the thickness of the first resin layer and the second resin layer. Moreover, the solder resist material of the present invention can prevent unnecessary resin from sticking out.

Further, in a preferred embodiment of the present invention, a resin composition constituting the first resin layer and the second resin layer comprises: a cyanate resin and/or a prepolymer thereof; an epoxy resin which does not substantially contain a halogen atom; a phenoxy resin which does not substantially contain a halogen atom; and an imidazole compound. When the first resin layer and the second resin layer of the solder resist material are composed of the above-described resin composition, a solder resist, which has excellent flame retardance, and which also has high heat resistance, high elastic modulus and low thermal expansion property, can be provided, wherein no detachment or crack is generated at the time of a test of thermal shock such as thermal cycle. According to a preferred embodiment of the present invention, a solder resist having excellent flame retardance can be provided, even if a halogen compound, which is widely used as a flame retardant, is not used.

Moreover, according to a preferred embodiment of the present invention, since the amount of ionic impurities of Na ion or Cl ion contained in the solder resist material is small, a solder resist having excellent moisture resistance reliability can be provided.

The present invention also provides a wiring board, to which a solder resist layer made of the above-described solder resist material is provided. According to a preferred embodiment of the present invention, a pore can be formed in the solder resist layer by means of laser irradiation, and a microscopical pore portion can be formed.

The present invention also provides a semiconductor package having the above-described wiring board.

BRIEF DESCRIPTION OF THE DRAWINGS

In FIG. 1, 1 designates a fiber base material-containing layer, 10 designates a solder resist material, 21 designates a first resin layer, and 22 designates a second resin layer.

In FIG. 2, 2 designates a solder resist material, 5a and 5b designate a carrier material, 6 designates a vacuum lamination apparatus, 11 designates a fiber base material, 61 designates a lamination roll, and 62 designates a hot air drier.

BEST MODE FOR CARRYING OUT THE INVENTION

Hereinafter, embodiments of a solder resist material, a wiring board to which a solder resist layer made of the solder resist material is provided, and a semiconductor package having the wiring board of the present invention will be described in detail.

The solder resist material of the present invention comprises at least a first resin layer, a second resin layer and a fiber base material-containing layer, and the fiber base material-containing layer is interposed between the first resin layer and the second resin layer.

Since the fiber base material-containing layer is interposed between the first resin layer and the second resin layer as described above, the solder resist material of the present invention has low coefficient of thermal expansion and high elastic modulus, and when used as a solder resist for a wiring board or the like, the warpage of a package can be effectively suppressed. In addition, reliability for thermal shock such as thermal cycle can be improved.

Figure 1:
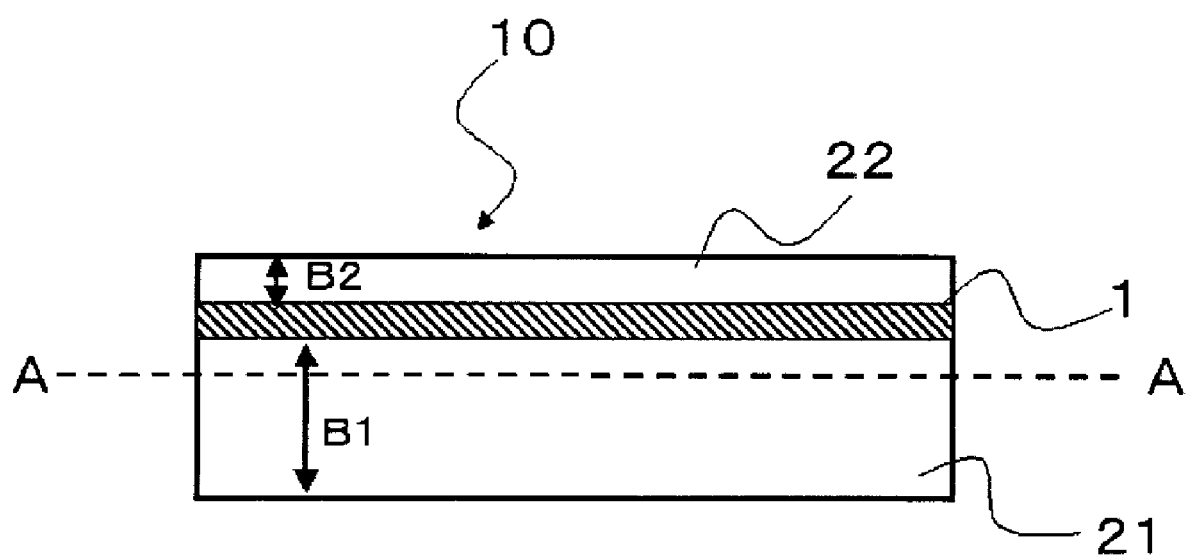
FIG. 1 is a schematic cross sectional view showing one example of the solder resist material of the present invention.

Hereinafter, a preferred embodiment of the solder resist material of the present invention will be explained with reference to the drawings. FIG. 1 is a schematic cross sectional view showing one example of the solder resist material of the present invention. As shown in FIG. 1, the fiber base material-containing layer 1 is interposed between the first resin layer 21 and the second resin layer 22 to constitute the solder resist material 10 of the present invention.

According to the present invention, the fiber base material-containing layer 1 can be located at any position along the thickness direction of the solder resist material 10. By locating the fiber base material-containing layer 1 at any position, the amount of resin of the first resin layer 21 and the second resin layer 22 can be adjusted depending on the circuit pattern, and thereby the circuit can be sufficiently embedded, and sticking out of extra resin can be prevented.

According to the present invention, the fiber base material-containing layer 1 is preferably unevenly distributed in the thickness direction of the solder resist material 10. In this regard, the description that the fiber base material-containing layer 1 is "unevenly distributed" means that the center of the fiber base material-containing layer 1 is shifted from the center line A-A of the thickness direction of the solder resist material 10 as shown in FIG. 1. The fiber base material-containing layer 1 may partially overlap the center line A-A.

As described above, according to a preferred embodiment of the present invention, the fiber base material-containing layer 1 can be unevenly distributed in the thickness direction of the solder resist material 10, and therefore, there is an advantage that the solder resist material 10, which has resin in an amount corresponding to the circuit pattern of an inner layer to be built up, can be designed.

In the case where the fiber base material-containing layer 1 is unevenly distributed in the thickness direction of the solder resist material 10 of the present invention, as shown in FIG. 1, when the thickness of the first resin layer 21 which is thicker is designated as B1 and the thickness of the second resin layer 22 which is thinner is designated as B2, the ratio thereof (B2/B1) preferably satisfies $0<B2/B1 \leqq 1$. The ratio (B2/B1) is more preferably 0.7 or less, and particularly preferably 0.1 to 0.4. When the ratio (B2/B1) is within the above-described range, corrugation of the fiber base material-containing layer can be reduced, and thereby flatness of the solder resist material can be more improved.

The solder resist material 10 of the present invention can comprise other constituent elements other than the first resin layer, the second resin layer and the fiber base material-containing layer. For example, either or both of the surfaces of the first and second resin layers may have a base material (carrier film) to be used at the time of production of the solder resist material. Further, the solder resist material 10 may have a cover film in order to prevent attachment of foreign materials and scratches on the outer surface of the first resin layer and/or the second resin layer. The carrier film and the cover film can be peeled from the solder resist material when used.

Hereinafter, the respective layers included in the solder resist material of the present invention will be described.

(1) First Resin Layer and Second Resin Layer

Firstly, the first resin layer and the second resin layer included in the solder resist material of the present invention will be described.

In the present invention, the first resin layer and the second resin layer are, for example, resin layers in which a resin composition is formed into a film-like shape. When using the solder resist material, a resin component contained in the first resin layer and the second resin layer is melted by heat and the like to cover concavo-convex surface of the circuit of the wiring board, and is subsequently cured, and thereby the first resin layer and the second resin layer can be formed on the surface of the wiring board.

The resin composition constituting the first resin layer and the second resin layer of the solder resist material of the present invention is not particularly limited as long as it has the above-described function. However, it preferably has low coefficient of thermal expansion and high elastic modulus and is excellent in reliability of heat resistance, thermal shock properties and moisture resistance. Moreover, in order to meet the needs for size reduction in electronic devices and a higher level of integration, it is preferred that a microscopical pore can be formed by means of laser irradiation.

For example, a thermosetting resin can be suitably used as the resin composition to be used in the present invention. In addition, according to need, additives such as a curing catalyst, a curing agent, an inorganic filler, a coupling agent and a coloring agent can be blended therein.

(a) Thermosetting Resin

Examples of thermosetting resins to be used in the present invention include: cyanate resins such as novolac type cyanate resins, and bisphenol type cyanate resins such as bisphenol A type cyanate resins, bisphenol E type cyanate resins and tetramethyl bisphenol F type cyanate resins; phenol resins such as novolac type phenol resins such as phenol novolac resins, cresol novolac resins and bisphenol A novolac resins, and resol type phenol resins such as unmodified resol phenol resins and oil-modified resol phenol resins which are modified with wood oil, linseed oil, walnut oil, etc.; bisphenol type epoxy resins such as bisphenol A type epoxy resins, bisphenol F type epoxy resins, bisphenol S type epoxy resins, bisphenol E type epoxy resins, bisphenol M type epoxy resins, bisphenol P type epoxy resins, and bisphenol Z type epoxy resins; novolac type epoxy resins such as phenol novolac type epoxy resins and cresol novolac type epoxy resins; epoxy resins such as biphenyl type epoxy resins, biphenyl aralkyl type epoxy resins, arylalkylene type epoxy resins, naphthalene type epoxy resins, anthracene type epoxy resins, phenoxy type epoxy resins, dicyclopentadiene type epoxy resins, norbornene type epoxy resins, adamantane type epoxy resins, and fluorene type epoxy resins; resins having a triazine ring such as urea resins and melamine resins; unsaturated polyester resins, bismaleimide resins, polyurethane resins, diallyl phthalate resins, silicone resins, resins having a benzooxazine ring, polyimide resins, polyamide-imide resins, and benzocyclobutene resins. In the present invention, one of the above-described resins can be used solely, or two or more of the resins can be used in combination. Moreover, resins, which belong to the same type and have a different weight-average molecular weight, can be used in combination. Furthermore, one or at least two of the above-described resins and prepolymers thereof can be used in combination. The content of the aforementioned thermosetting resin is not particularly limited, but is preferably 50 to 100 wt %, and more preferably 60 to 90 wt % of the total weight of the resin composition. When the content is within the above-described range, melting ability at the time of embedding the circuit is improved.

Resins which are excellent in flame retardance such as brominated epoxy resins may be used as the thermosetting resin. However, because of recent increasing awareness of environmental issues, use of a material which does not substantially contain a halogen atom is desired.

The resin composition to be used in the present invention particularly preferably comprises a cyanate resin and/or a prepolymer thereof as the thermosetting resin. When using the cyanate resin, the coefficient of thermal expansion of the resin layers can be decreased. In addition, the flame retardance of the resin layers can be improved. Moreover, advantageously, the cyanate resin is excellent in electrical properties (low permittivity and low dielectric loss tangent), mechanical strength, etc.

In the present invention, the resin composition constituting the first resin layer and the second resin layer particularly preferably comprises: a cyanate resin and/or a prepolymer thereof; an epoxy resin which does not substantially contain a halogen atom; and a phenoxy resin which does not substantially contain a halogen atom.

(i) Cyanate Resin and/or Prepolymer Thereof.

The resin composition to be used in the present invention preferably comprises a cyanate resin and/or a prepolymer thereof. This makes it possible to decrease the coefficient of thermal expansion of the resin layers and to improve the flame retardance thereof.

The method for obtaining a cyanate resin and/or a prepolymer thereof is not particularly limited. For example, it can be obtained by reacting a halogenated cyanogen compound with phenols and subjecting the reaction mixture to prepolymeration using a method such as heating according to need. Commercially-available products, which are prepared as described above, can also be used.

The type of the cyanate resin is not particularly limited. Examples thereof include novolac type cyanate resins, and bisphenol type cyanate resins such as bisphenol A type cyanate resins, bisphenol E type cyanate resins and tetramethyl bisphenol F type cyanate resins.

Among the above-described resins, novolac type cyanate resins are preferred. They increase the crosslink density, and thereby make it possible to improve the heat resistance and to further improve the flame retardance. It is thought that this is because the novolac type cyanate resin has a high ratio of benzene ring because of its structure and therefore tends to be easily carbonized.

The novolac type cyanate resin can be obtained, for example, by reacting a novolac type phenol resin with a compound such as cyanogen chloride and cyanogen bromide. Commercially-available products, which are prepared as described above, can also be used.

For example, as the novolac type cyanate resin, those represented by general formula (1) can be used.

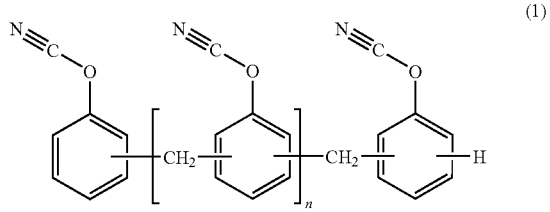

(1)

The weight-average molecular weight of the novolac type cyanate resin represented by general formula (1) is not particularly limited, but may be 500 to 4,500, and is preferably 600 to 3,000. In the present invention, the weight-average molecular weight means a value obtained from the measurement by means of GPC with polystyrene conversion. When the weight-average molecular weight is within the aforementioned range, a solder resist, whose mechanical strength and curing rate are not reduced, can be obtained.

As the cyanate resin, a prepolymer thereof can also be used. That is, a cyanate resin can be used solely, cyanate resins having a different weight-average molecular weight can be used in combination, or a cyanate resin and a prepolymer thereof can be used in combination.

In general, a prepolymer can be obtained, for example, by trimerizing a cyanate resin by means of thermal reaction or the like, and is preferably used in order to adjust formability and flowability of the resin composition.

In the present invention, the prepolymer is not particularly limited. For example, those having a trimerization ratio of 20 to 50 wt % can be used. The trimerization ratio can be obtained, for example, using an Fourier Transform Infrared Spectrophotometer.

In the present invention, the content of the cyanate resin is not particularly limited. From the viewpoint of effective exertion of the aforementioned properties of the cyanate resin, the content of the cyanate resin is preferably 5 to 50 wt %, and more preferably 10 to 40 wt % of the total weight of a resin composition. When the content of the cyanate resin is within the aforementioned range, the crosslink density does not become high, and therefore a solder resist, which is excellent in moisture resistance and high heat resistance, can be obtained.

(ii) Epoxy Resin which does not Substantially Contain a Halogen Atom

The resin composition to be used in the present invention preferably comprises an epoxy resin which does not substantially contain a halogen atom. In this case, even if the solder resist material is heated to a high temperature which is equal to or higher than the glass transition temperature at the time of mounting or the like, corrosion of the circuit due to halogen atoms does not occur, and the reliability after the mounting is improved. As used herein, the expression "does not substantially contain a halogen atom" means that halogen atoms may be contained in a slight amount, which does not lead to corrosion of the circuit due to halogen atoms, and which does not affect the reliability after the mounting, and that preferably, no halogen atom is contained.

The aforementioned epoxy resin is not particularly limited. Examples thereof include phenol novolac type epoxy resins, bisphenol type epoxy resins, naphthalene type epoxy resins, and arylalkylene type epoxy resins. Among these resins, arylalkylene type epoxy resins are preferred. They make it possible to improve flame retardance and solder heat resistance after moisture absorption.

As used herein, the "arylalkylene type epoxy resin" refers to an epoxy resin in which a repeat unit has one or more arylalkylene groups. Examples thereof include xylylene type epoxy resins and biphenyl dimethylene type epoxy resins. Among these resins, biphenyl dimethylene type epoxy resins are preferred. As biphenyl dimethylene type epoxy resins, for example, those represented by general formula (2) can be used.

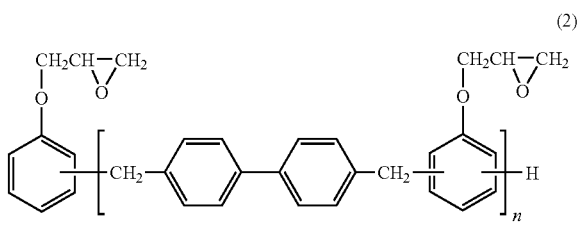

(2)

Regarding the biphenyl dimethylene type epoxy resins represented by general formula (2), n is preferably 1 to 10, and more preferably 2 to 5. When n is within the aforementioned range, a solder resist, in which a biphenyl dimethylene type epoxy resin is less likely to be crystallized and decrease in the solubility in a general-purpose solvent is reduced, leading to easier handling, and which is excellent in flowability and formability, can be obtained.

The weight-average molecular weight of the aforementioned epoxy resin is not particularly limited, but is preferably 4,000 or less, more preferably 500 to 4,000, and particularly preferably 800 to 3,000. When it is within the aforementioned range, a solder resist, which has no tackiness and is excellent in solder heat resistance, can be obtained.

The content of the aforementioned epoxy resin is not particularly limited, but is preferably 5 to 50 wt %, and more preferably 10 to 40 wt % of the total weight of the resin composition.

When the content of the epoxy resin is within the aforementioned range, a solder resist, which is excellent in solder heat resistance after moisture absorption, adhesion and low thermal expansion property, can be obtained.

(iii) Phenoxy Resin which does not Substantially Contain a Halogen Atom

The resin composition to be used in the present invention preferably comprises a phenoxy resin which does not substantially contain a halogen atom. In this case, when the solder resist material is attached to an insulation layer to which a conductor circuit is provided by means of thermocompression bonding, adhesion is improved. Moreover, when a pore portion is provided to a position of the solder resist layer opposed to the conductor circuit on which a solder ball for external connection is mounted by opening a pore by means of laser irradiation and removing resin residue (smear), resin residue is more easily removed because phenoxy resin is contained. As used herein, the expression "does not substantially contain a halogen atom" means that halogen atoms may be contained in a slight amount, which does not lead to corrosion of the circuit due to halogen atoms, and which does not affect the reliability after the mounting, and that preferably, no halogen atom is contained.

The aforementioned phenoxy resin is not particularly limited. Examples thereof include phenoxy resin having a bisphenol structure, phenoxy resin having a novolac structure, phenoxy resin having a naphthalene structure, and phenoxy resin having a biphenyl structure. Phenoxy resin, which has a structure having a plurality of types of structures, can also be used.

Among the above-described phenoxy resins, those having a biphenyl structure and a bisphenol S structure are preferably used. In this case, a glass transition temperature can be increased because of rigidity of a biphenyl structure.

Phenoxy resins having a bisphenol A structure and a bisphenol F structure are also preferably used. In this case, adhesion to an inner layer circuit board at the time of production of a multilayer wiring board can be improved.

Preferably, phenoxy resin having a biphenyl structure and a bisphenol S structure and phenoxy resin having a bisphenol A structure and a bisphenol F structure are used in combination. In this case, the aforementioned properties can be exerted in a balanced manner.

When phenoxy resin having a bisphenol A structure and a bisphenol F structure (1) and phenoxy resin having a biphenyl structure and a bisphenol S structure (2) are used in combination, the ratio thereof is not particularly limited. For example, (1):(2) may be 2:8 to 9:1.

The molecular weight of the aforementioned phenoxy resin is not particularly limited, but the weight-average molecular weight is preferably 5,000 to 70,000, more preferably 5,000 to 50,000, and even more preferably 10,000 to 40,000. When the weight-average molecular weight of the phenoxy resin is within the aforementioned range, film-forming ability is improved, and a resin composition having good solubility can be obtained.

The content of the aforementioned phenoxy resin is not particularly limited, but is preferably 1 to 40 wt %, and more preferably 5 to 30 wt % of the total weight of the resin composition. When the content of the phenoxy resin is within the aforementioned range, film-forming ability is improved, and a resin composition which can maintain low thermal expansion property can be obtained.

(b) Curing Catalyst

According to need, a curing catalyst can be used for the resin composition to be used in the present invention. The curing catalyst is not particularly limited, and can be suitably selected depending on the type of a thermosetting resin to be used, etc.

Examples thereof include: organometallic salts such as zinc naphthenate, cobalt naphthenate, tin octylate, cobalt octylate, bisacetylacetonato cobalt (II), and trisacetylacetonato cobalt (III); tertiary amines such as triethylamine, tributylamine, and diazabicyclo[2,2,2]octane; imidazole compounds; phenol compounds such as phenol, bisphenol A, and nonyl phenol; organic acids such as acetic acid, benzoic acid, salicylic acid, and para-toluenesulphonic acid; and mixtures thereof. Among them, imidazole compounds are preferably used in the present invention.

In particular, the resin composition to be used in the present invention preferably contains an imidazole compound. In this case, insulation properties of the solder resist is not reduced, and reactions of cyanate resin and epoxy resin can be accelerated.

The imidazole compound is not particularly limited. Examples thereof include 2-phenyl-4-methylimidazole, 2-phenyl-4-methyl-5-hydroxymethylimidazole, 2-phenyl-4,5-dihydroxymethylimidazole, 2,4-diamino-6-[2'-methylimidazolyl-(1')]-ethyl-s-triazine, 2,4-diamino-6-(2'-undecylimidazolyl)-ethyl-s-triazine, 2,4-diamino-6-[2'-ethyl-4-methylimidazolyl-(1')]-ethyl-s-triazine, and 1-benzyl-2-phenylimidazole.

Among them, an imidazole compound having 2 or more functional groups selected from an aliphatic hydrocarbon group, an aromatic hydrocarbon group, a hydroxyalkyl group and a cyanoalkyl group is preferred, and 2-phenyl-4,5-dihydroxymethylimidazole is particularly preferred. When using such an imidazole compound, heat resistance of a solder resist can be improved, and low thermal expansion property and low water absorbability are imparted to the solder resist.

The content of the curing catalyst may be suitably selected in consideration of the type of resin and curing time, and is not particularly limited. When imidazole is used as the curing catalyst, the content of the imidazole compound is not particularly limited, but is preferably 0.05 to 5 wt %, more preferably 0.1 to 5 wt %, and even more preferably 0.1 to 3 wt % of the total weight of cyanate resin and epoxy resin. This particularly makes it possible to improve heat resistance of the solder resist.

When epoxy resin such as brominated epoxy resin is used as the thermosetting resin, it is preferred that the resin composition comprises a curing agent and/or a curing catalyst. The curing agent and/or the curing catalyst are not particularly limited as long as they are generally used as a curing agent or a curing catalyst for epoxy resin. For example, amine compounds such as dicyandiamide are suitably used as the curing agent, and imidazole compounds such as 2-ethyl-4-methylimidazole are suitably used as the curing catalyst. In this case, use amounts of the curing agent and the curing catalyst are not particularly limited, but both are preferably 0.05 to 5 wt %, more preferably 0.1 to 5 wt %, and even more preferably 0.1 to 3 wt % of the content of the epoxy resin.

(c) Inorganic Filler

The resin composition to be used in the present invention may further comprise an inorganic filler. This makes it possible to improve low thermal expansion property and flame retardance. Further, the elastic modulus can be improved by combination of a cyanate resin and/or a prepolymer thereof (in particular, a novolac type cyanate resin) and an inorganic filler.

The inorganic filler is not particularly limited. Examples thereof include talc, alumina, glass, silica, and mica. Among them, silica is preferred, and molten silica is particularly preferred in terms of excellent low expansion property.

Molten silica has a granular or spherical shape, and a spherical shape is preferred. When using molten silica having such a shape, a larger amount thereof can be blended in the resin composition, and even in this case, good flowability can be imparted thereto.

The average particle size of the inorganic filler is not particularly limited, but is preferably 0.01 to 5 μm, and more preferably 0.2 to 2 μm.

When the average particle size of the inorganic filler is within the aforementioned range, workability at the time of preparing the resin composition varnish is improved, and precipitation of the inorganic filler can be suppressed.

The content of the inorganic filler is not particularly limited, but is preferably 20 to 70 wt %, and more preferably 30 to 60 wt % of the total weight of the resin composition.

When the content of the inorganic filler is within the aforementioned range, a solder resist, which is excellent in low thermal expansion property and low water absorbability, and which has good flowability and formability, can be obtained.

(d) Coupling Agent

The resin composition to be used in the present invention may further comprise a coupling agent. When using the coupling agent, wettability of the boundary face between the resin and the inorganic filler can be improved, and therefore, heat resistance, in particular, solder heat resistance after moisture absorption can be improved.

The coupling agent is not particularly limited, but one or more coupling agents selected from epoxy silane coupling agents, titanate type coupling agents, aminosilane coupling agents, and silicone oil type coupling agents are preferably used. This particularly makes it possible to improve wettability of the boundary face between the resin and the inorganic filler, and heat resistance can be further improved.

The content of the coupling agent is not particularly limited, but is preferably 0.05 to 3 parts by weight per 100 parts by weight of the inorganic filler. When the content of the coupling agent is within the aforementioned range, heat resistance is improved by coating the inorganic filler, and a solder resist having good bending strength can be obtained.

(e) Coloring Agent

A coloring agent can be added to the resin composition to be used in the present invention according to need. Green color is generally considered as eye-friendly at the time of confirmation of a pore portion and visual observation for long periods of time. Examples of colors include black, green, red, blue, yellow and orange, but green is particularly preferred. As a green coloring agent, chlorinated phthalocyanine green is used. However, for the purpose of dehalogenation, for example, a green pigment obtained by mixing a blue pigment with a yellow pigment and/or an orange pigment is preferably used instead of chlorinated phthalocyanine. The blue pigment contained in the aforementioned green pigment mixture is not particularly limited as long as it is a blue pigment which does not contain any halogen atom in its compound structure.

Examples thereof include copper phthalocyanine blue (C. I. Pigment Blue 15), metal-free phthalocyanine blue (C. I. Pigment Blue 16), titanyl phthalocyanine blue, iron phthalocyanine blue, nickel phthalocyanine blue, aluminum phthalocyanine blue, tin phthalocyanine blue, alkali blue (C. I. Pigment Blue 1, 2, 3, 10, 14, 18, 19, 24, 56, 57, 61), sulfonated CuPc (C. I. Pigment Blue 17), iron blue (C. I. Pigment Blue 27), ultramarine blue (C. I. Pigment Blue 29), cobalt blue (C. I. Pigment Blue 28), sky blue (C. I. Pigment Blue 35), Co(Al, Cr)$_2$O$_4$ (C. I. Pigment Blue 36), disazo (C. I. Pigment Blue 25, 26), indanthrone (C. I. Pigment Blue 60), indigo (C. I. Pigment Blue 63, 66), and cobalt phthalocyanine (C. I. Pigment Blue 75). Among them, metal-free phthalocyanine blue and copper phthalocyanine blue are preferred.

The aforementioned yellow pigment is not particularly limited as long as it does not contain any halogen atom in its compound structure. Examples thereof include monoazo yellow (C. I. Pigment Yellow 1, 4, 5, 9, 65, 74), benzimidazolone yellow (C. I. Pigment Yellow 120, 151, 175, 180, 181, 194), flavanthrone yellow (C. I. Pigment Yellow 24), azomethyl yellow (C. I. Pigment Yellow 117, 129), anthraquinone yellow (C. I. Pigment Yellow 123, 147), isoindoline yellow (C. I. Pigment Yellow 139, 185), disazo yellow (C. I. Pigment Yellow 155), condensed polycyclic system (C. I. Pigment Yellow 148, 182, 192), iron oxide (C. I. Pigment Yellow 42), disazomethine (C. I. Pigment Yellow 101), azo lake (C. I. Pigment Yellow 61, 62, 100, 104, 133, 168, 169), and metal complex (C. I. Pigment Yellow 150, 153, 177, 179). Benzimidazolone yellow (C. I. Pigment Yellow 151) is particularly preferred.

The aforementioned orange pigment is not particularly limited as long as it does not contain any halogen atom in its compound structure. Examples of orange pigments include perinone (C. I. Pigment Orange 43), benzimidazolone (C. I. Pigment Orange 62), azomethine (C. I. Pigment Orange 64), and diketopyrrolopyrrole (C. I. Pigment Orange 71). Benzimidazolone (C. I. Pigment Orange 62) and azomethine (C. I. Pigment Orange 64) are particularly preferred.

Regarding the mixing ratio between the blue pigment and the yellow pigment and/or the orange pigment, the weight ratio of the yellow pigment and/or the orange pigment to the blue pigment (blue pigment: yellow pigment and/or orange pigment) is preferably 1:10 to 10:1, and more preferably 3:7 to 7:3. When the weight ratio is outside the range of 1:10 to 10:1, it is not preferred because green color is no longer obtained.

Examples of organic solvents to be used in order to disperse pigment components in the green pigment mixture to be used in the present invention include, but are not particularly limited to, acetone, methanol, methyl ethyl ketone, methyl isobutyl ketone, 2-(methoxymethoxy)ethanol, 2-butoxyethanol, 2-(isopentyloxy)ethanol, 2-(hexyloxy)ethanol, diethylene glycol, diethylene glycol monomethyl ether, diethylene glycol monoethyl ether, diethylene glycol monobutyl ether, triethylene glycol, triethylene glycol monomethyl ether, liquid polyethylene glycol, 1-methoxy-2-propanol, 1-ethoxy-2-propanol, dipropylene glycol, dipropylene glycol monomethyl ether, dipropylene glycol monoethyl ether, and liquid polypropylene glycol. The organic solvent is not limited as long as it is highly compatible with the aforementioned pigment components and realizes easy dispersion. Preferably, the organic solvent is also easily dispersed in the resin composition. Further, there is no particular problem in a method in which a stirring apparatus or ultrasonic agitation is used for physical dispersion, or a method in which a green pigment obtained by mixing a blue pigment with a yellow pigment and/or an orange pigment is dispersed in a solvent in advance, and the dispersion liquid is mixed with the resin composition in order to improve dispersibility. Stirring time and stirring rate are not particularly limited.

In the case where the pigment is dispersed in the solvent in advance, the amount of the solvent is preferably 2 to 20 parts by weight, and more preferably 4 to 10 parts by weight per 1 part by weight of the pigment. When the amount is within the aforementioned range, it realizes high dispersibility, and when producing the solder resist material, time to remove the solvent is reduced.

Regarding the ratio of the green pigment to be contained in the resin composition, the content of the green pigment is preferably 0.01 to 10 wt %, and more preferably 0.1 to 5 wt % of the total weight of the resin composition. When the content is within the aforementioned range, it realizes good color, the circuit under the solder resist can be observed, and a circuit pad can be easily recognized by means of a laser irradiation apparatus when opening a pore.

Other than the above-described components, additives such as an antifoam agent and a leveling agent can be contained in the resin composition to be used in the present invention according to need.

In the solder resist material of the present invention, a resin composition constituting the first resin layer and a resin composition constituting the second resin layer may be the same or different. When different resin compositions are used for the first resin layer and the second resin layer, for example, the difference may be made by changing the type or use amount of a resin to be used. Alternatively, the difference may be made by changing the type or use amount of additives such as an inorganic filler. When resin compositions, whose compositions are different from each other, can be used for the first resin layer and the second resin layer, it has the advantages that a resin layer having a required performance can be designed, and that the range of selection of resin can be expanded. For example, a resin layer facing the inner layer circuit may have a flexible composition in consideration of embedding ability, and an opposite layer may have a rigid composition in consideration of rigidity. Thus, different functions can be imparted to the respective sides of the solder resist material.

In the solder resist material of the present invention, the thickness of the first resin layer is not particularly limited, but is preferably larger than the thickness of the second resin layer, and it is enough when it is sufficient to embed a circuit layer embedded by the first resin layer. For example, when the thickness of the circuit layer to be embedded is designated as T and the thickness of the first resin layer is designated as t, (T/t) is preferably $0.3 \leqq (T/t) \leqq 2$, and more preferably $0.5 \leqq (T/t) \leqq 1.5$. In general, in order to sufficiently embed the circuit, the thickness of the resin layer facing the inner layer circuit is preferably thickened.

(2) Fiber Base Material-Containing Layer

Hereinafter, the fiber base material-containing layer to be used in the solder resist material of the present invention will be described.

In the solder resist material of the present invention, the fiber base material-containing layer is a layer made by impregnating a fiber base material with a resin material. Since the solder resist material of the present invention comprises the fiber base material-containing layer, low coefficient of thermal expansion and high elastic modulus can be achieved.

The fiber base material to be used in the fiber base material-containing layer is preferably selected from a glass fiber base material and an organic fiber base material. When a fiber base material as described above is interposed between the resin layers, the warpage of the wiring board having the solder resist layer consisting of the solder resist material of the present invention can be prevented.

Examples of glass fiber base materials to be used in the present invention include glass woven fabric and glass nonwoven fabric. Among them, glass woven fabric is preferred. Further, the aforementioned glass fiber base material may be subjected to surface treatment using a coupling agent in order to improve adhesion. Examples thereof include aminosilane coupling treatment, vinylsilane coupling treatment, and cationic silane coupling treatment. Epoxysilane coupling treatment is more suitable for impregnating the glass fiber base material with the aforementioned resin composition.

When using the glass fiber base material treated with the epoxysilane coupling agent, adhesion to the cyanate resin can be improved.

Examples of organic fiber base materials to be used in the present invention include an organic nonwoven fabric and an organic woven fabric. When using these materials, excellent laser workability is realized. Examples of organic fiber base materials include: synthetic fiber base materials having fibers made of polyethylene, polypropylene, vinylon, polyvinyl chloride, polyvinylidene chloride, polyacrylonitrile, polyamide, polyester, polyurethane, a modified product thereof or the like, or mixtures thereof; polybenzoxazole resin fiber; polyamide type resin fibers such as polyamide resin fiber, aromatic polyamide resin fiber, and wholly aromatic polyamide resin fiber; polyester type resin fibers such as polyester resin fiber, aromatic polyester resin fiber, liquid crystalline polyester, and wholly aromatic polyester resin fiber; polyimide resin fiber; a fluorine resin fiber or the like as the main component; and paper base materials having craft paper, cotton linter, composite paper consisting of linter and craft pulp or the like as the main component. Among them, liquid crystalline polyester is preferred in terms of moisture resistance.

Among the above-described fiber base materials, the glass fiber base material is preferably used in the present invention. In particular, the glass fiber base material having a coefficient of thermal expansion (CTE) of 6 ppm or less is preferably used. The glass fiber base material having a coefficient of thermal expansion of 3.5 ppm or less is more preferably used. When using the glass fiber base material having the coefficient of thermal expansion as described above, at the time of forming the solder resist layer on the wiring board using the solder resist material of the present invention, the warpage of the semiconductor package can be suppressed more effectively. The coefficient of thermal expansion can be measured according to the method described in the Examples.

The basis weight (the weight of the fiber base material per 1 m$^2$) of the glass fiber base material to be used in the present invention is preferably 4 to 24 g/m$^2$, more preferably 8 to 20 g/m$^2$, and even more preferably 12 to 18 g/m$^2$.

The Young's modulus of the glass fiber base material to be used in the present invention is preferably 62 to 100 GPa, more preferably 65 to 92 GPa, and even more preferably 86 to 92 GPa. When the Young's modulus of the glass fiber base material is within the above-described range, for example, deformation of the wiring board due to reflow heat at the time of mounting a semiconductor can be suppressed effectively. Therefore, reliability of connection of electronic parts is improved.

The permittivity of the glass fiber base material to be used in the present invention at 1 MHz is preferably 3.8 to 11.1, more preferably 4.7 to 7.0, and even more preferably 5.4 to 6.8. When the permittivity of the glass fiber base material is within the above-described range, the permittivity of the solder resist can be reduced, and it is suitable for a semiconductor package using a high-speed signal.

As the glass fiber base material having the coefficient of thermal expansion, Young's modulus and permittivity as described above, for example, E glass, S glass, NE glass, and T glass are suitably used.

The thickness of the fiber base material to be used in the present invention is preferably 5 to 35 μm, more preferably 10 to 20 μm, and even more preferably 14 to 15 μm. Further, the number of the fiber base materials to be used may be one, or a plurality of thin fiber base materials may be used by stacking them. When a plurality of fiber base materials are stacked, all that is required is that the total thickness thereof satisfies the above-described range.

In the present invention, glass nonwoven fabric or glass woven fabric having the thickness of 10 to 15 μm and the basis weight of 8 to 18 g/m$^2$ is particularly preferably used. When using such glass nonwoven fabric or glass woven fabric, the warpage of the semiconductor package can be prevented more effectively.

In the solder resist material of the present invention, the fiber base material-containing layer is a layer made by impregnating the above-described fiber base material with the resin composition constituting the first resin layer and the second resin layer. In general, the thickness of the fiber base material-containing layer can be regarded as the thickness of the fiber base material. That is, the thickness of the fiber base material-containing layer is preferably 5 to 35 μm, more preferably 10 to 20 μm, and even more preferably 14 to 15 μm.

Since the solder resist material of the present invention has a fiber base material-containing layer obtained by impregnating a fiber base material such as a glass fiber base material and an organic fiber base material with a resin composition, the solder resist material is excellent in low coefficient of thermal expansion and high elastic modulus, and the warpage of a thin wiring board comprising the solder resist material or a semiconductor package in which a semiconductor chip is mounted on the thin wiring board is suppressed. Moreover, by suitably selecting the composition of the resin composition, the solder resist material, which is excellent in reliability of heat resistance, thermal shock properties and moisture resistance, can be obtained. In particular, because of the presence of the fiber base material-containing layer obtained by impregnating the glass fiber base material with the resin composition, high strength, low water absorption and low thermal expansion can be achieved.

As described above, the solder resist material of the present invention is preferably made by impregnating the fiber base material with the resin composition. In particular, the solder resist material of the present invention is preferably made by impregnating the glass fiber base material with a resin composition which comprises: a cyanate resin and/or a prepolymer thereof; an epoxy resin which does not substantially contain a halogen atom; a phenoxy resin which does not substantially contain a halogen atom; and an imidazole compound.

In addition, according to a preferred embodiment of the present invention, the amount of Na ion or Cl ion contained in the solder resist material of the present invention is preferably 10 ppm or less. This makes it possible to further improve reliability of moisture resistance of the solder resist.

Examples of methods for producing the solder resist material of the present invention include methods in which a resin composition is dissolved in an organic solvent to obtain a resin composition varnish and it is impregnated into or applied to a fiber base material.

Examples thereof include: a method in which a resin composition is dissolved in a solvent to prepare a resin composition varnish, and a fiber base material is immersed in the resin composition varnish; a method in which the resin composition varnish is applied to the fiber base material using various types of coaters; a method in which the resin composition varnish is sprayed on the fiber base material; and a method in which the fiber base material is laminated with a resin layer with a support base material. Among them, the method in which the fiber base material is immersed in the resin composition varnish is preferred. This makes it possible to improve impregnation ability of the resin composition with respect to the fiber base material. When the fiber base material is immersed in the resin composition varnish, an ordinary impregnation/application equipment can be used.

When the fiber base material is immersed in the resin composition varnish, it is desired that a solvent to be used for the resin composition varnish exhibits good solubility in a resin component in the resin composition. However, a poor solvent may be used without adverse effect.

For example, a resin composition varnish can be obtained by: dissolving a cyanate resin and/or a prepolymer thereof, an epoxy resin which does not substantially contain a halogen atom, a phenoxy resin which does not substantially contain a halogen atom, an imidazole compound, and an inorganic filler in an organic solvent such as methyl isobutyl ketone, methyl ethyl ketone, carbitol acetate and cellosolve acetate; adding additives thereto according to need; and thereafter stirring the mixture at room temperature for 2 to 5 hours. In this regard, it is preferred that the inorganic filler is dispersed in a resin which can be dissolved in a cyanate resin and/or a prepolymer thereof, an epoxy resin which does not substantially contain a halogen atom, and a phenoxy resin which does not substantially contain a halogen atom in advance, or dispersed in the organic solvent in advance. When the inorganic filler is dispersed in advance, secondary aggregation can be prevented. Further, since the inorganic filler is no longer inhomogeneously dispersed in the resist layer, no residue is generated after laser irradiation, and therefore, a good pore can be opened. More preferably, an inorganic filler having fine particles is dispersed.

Examples of organic solvents to be used include acetone, methanol, methyl ethyl ketone, methyl isobutyl ketone, 2-(methoxymethoxy)ethanol, 2-butoxyethanol, 2-(isopentyloxy)ethanol, 2-(hexyloxy)ethanol, diethylene glycol, diethylene glycol monomethyl ether, diethylene glycol monoethyl ether, diethylene glycol monobutyl ether, triethylene glycol, triethylene glycol monomethyl ether, liquid polyethylene glycol, 1-methoxy-2-propanol, 1-ethoxy-2-propanol, dipropylene glycol, dipropylene glycol monomethyl ether, dipropylene glycol monoethyl ether, liquid polypropylene glycol, cyclohexanone, tetrahydrofuran, dimethylformamide, dimethylacetamide, dimethyl sulfoxide, cellosolve-based solvents, and carbitol-based solvents. Among them, methyl isobutyl ketone, methyl ethyl ketone, carbitol acetate, cellosolve acetate and the like are preferred.

The solid content of the resin composition varnish is not particularly limited, but is preferably 40 to 80 wt %, and particularly preferably 50 to 65 wt %. This makes it possible to further improve impregnation ability of the resin composition varnish with respect to the fiber base material. By impregnating the fiber base material with the resin composition and drying it at a predetermined temperature, e.g., a temperature in the range of 80 to 200° C., the solder resist material of the present invention can be obtained.

Alternatively, the resin composition varnish is applied on a base material such as a PET film so that the thickness of the varnish becomes about 1 to 60 μm in general, and it is subjected to heat treatment at a temperature of about 60 to 180° C. for about 5 to 10 minutes, and thereby a solvent in the resin composition varnish is removed to obtain a solidified or pre-polymerized resin composition. A fiber base material is interposed between two layers of the resin composition to be pressed by means of a vacuum pressing apparatus, a laminator or the like. Thus, a solder resist material, whose thickness is controlled with a higher degree of accuracy, can be obtained.

In particular, when the thickness of the fiber base material is 0.045 mm or less, a method in which both sides of the fiber base material are laminated with a film-type resin layer is preferred. By employing the method, the amount of the resin composition to be impregnated into the fiber base material can be controlled freely, and formability of prepreg can be improved. When a film-type resin layer is used for lamination, a vacuum lamination apparatus is preferably used.

Figure 2:
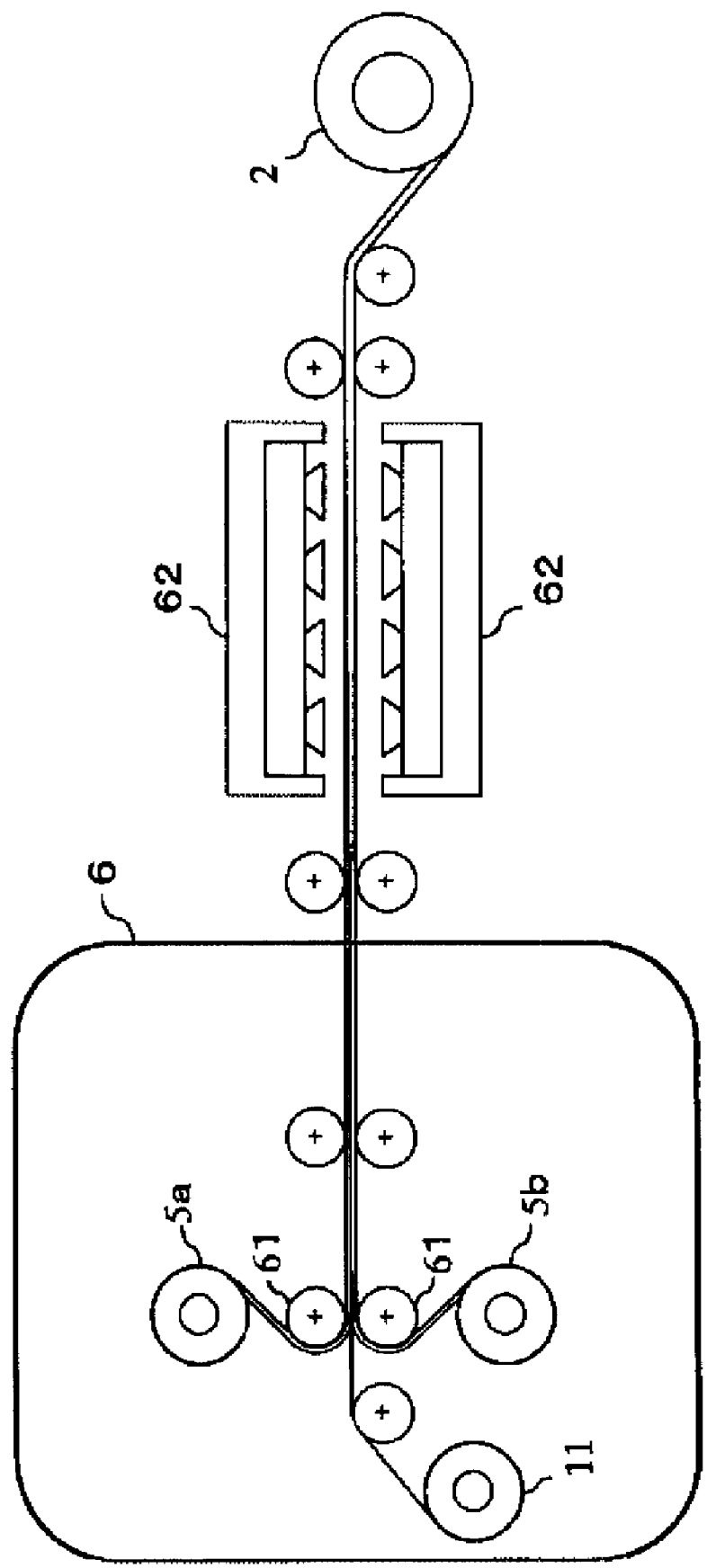
FIG. 2 shows one example of the process for producing the solder resist material of the present invention.

Examples of methods for producing the solder resist material of the present invention in which both surfaces of the fiber base material are laminated with a film-type resin layer include the following method. FIG. 2 shows one example of the process for producing the solder resist material of the present invention. In this process, carrier materials 5a and 5b, in each of which a resin composition is applied to a carrier film in advance, are produced, and after a fiber base material 11 is laminated with the carrier materials 5a and 5b, the carrier films are peeled off to produce a solder resist material 2.

More specifically, firstly, a carrier material 5a, in which a first resin composition is applied to a carrier film, and a carrier material 5b, in which a second resin composition is applied to another carrier film, are produced. Next, using a vacuum lamination apparatus 6, both surfaces of the fiber base material are overlapped by the carrier materials 5a and 5b, respectively, under reduced pressure, and they are bound together using a lamination roll 61. In the case where materials are bound together under reduced pressure as described above, if an unfilled portion is present in the inside of the fiber base material 11 or the bound portion between the resin layers on the carrier materials 5a and 5b and the fiber base material 11, it can be a pressure reduced void or a substantial vacuum void. Therefore, voids generated in the solder resist material 2 finally obtained can be decreased. That is because pressure reduced voids or vacuum voids can be eliminated by means of heat treatment as described below. As other apparatuses for binding the fiber base material 11 and the carrier materials 5a and 5b together under reduced pressure, for example, a vacuum box apparatus, etc. can be used.

Next, after binding the fiber base material 11 and the carrier materials 5a and 5b together, it is subjected to heat treatment at a temperature equal to or higher than the melting temperature of the resin applied to the carrier materials using a hot air drier 62. This makes it possible to eliminate most pressure reduced voids, etc. generated in the aforementioned binding process under reduced pressure. In other methods of heat treatment, for example, an infrared heating apparatus, a heated roll apparatus, a plate-type heat platen pressing apparatus, etc. can be used.

After the fiber base material 11 is laminated with the carrier materials 5a and 5b, the carrier films are peeled off. According to this method, the solder resist material 2, which comprises the fiber base material-containing layer in which the resin layer is carried on the fiber base material 11 and the resin is impregnated into the fiber base material 11, can be obtained.

When compared to conventional solder resists, the solder resist material of the present invention thus obtained has a higher elastic modulus, and in particular, the expansion coefficient in the in-plane direction is significantly reduced. Therefore, the material is suitably used for solder resist. Moreover, since the warpage can be effectively suppressed when using the solder resist material of the present invention, it can be suitably used for a thin wiring board.

The solder resist material of the present invention can be used by being subjected to lamination at a predetermined position on a wiring board or the like, heating and melting, and curing. For example, the solder resist material is subjected to lamination at a predetermined position on a wiring board or the like, molding, and curing at 100 to 260° C. for 1 to 5 hours. The solder resist material of the present invention is suitable as a solder resist layer for wiring boards such as a BGA substrate, a BOC (Board On Chip) substrate, a SiP (System in Package) substrate, Top and Bottom substrates for POP (Package on Package), a rigid portion of a substrate for module connection consisting of a multilayer buildup wiring board, an interposer for mounting flip chip BGA, a passive component part and a mother board for mounting the aforementioned interposer. The present invention also includes a wiring board having the solder resist layer consisting of the solder resist material of the present invention as described above.

In the solder resist layer of the wiring board of the present invention, a pore portion (solder resist pore portion) for mounting a semiconductor chip, an electronic part or the like is provided. In the present invention, a method for forming the above-described solder resist pore portion is not particularly limited. A method in which a pore is opened by a punch, a drill or laser in advance and thereafter lamination is carried out, and a method in which a solder resist layer is formed on a wiring board and thereafter a pore is opened by irradiation with laser light or the like can be employed. Among them, using laser irradiation is preferred on the point that a microscopical pore portion can be easily formed. For example, laser irradiation using a carbon dioxide gas laser, a third-harmonic wave UV-YAG laser, a fourth-harmonic wave UV-YAG laser or an excimer laser is preferably employed to form the pore portion of the solder resist layer. A laser to be used may be suitably selected depending on the size of a desired pore diameter. For example, when the pore diameter is 10 to 100 μm, a third-harmonic wave UV-YAG laser, a fourth-harmonic wave UV-YAG laser and an excimer laser are preferably used. In particular, in terms of workability with respect to a microscopical pore, a third-harmonic wave UV-YAG laser is preferred, a fourth-harmonic wave UV-YAG laser is more preferred, and an excimer laser is particularly preferred. When the pore diameter is 40 to 300 μm, a carbon dioxide gas laser is desired for use. After opening a pore with such a laser, the layer is preferably immersed in a permanganate solution (a chemical for desmear treatment) to remove resin residue (smear) of the pore portion. Alternatively, it is preferred that after opening a pore with laser irradiation, resin residue (smear) of the pore portion is removed by employing the dry etching method using plasma or the like.

A semiconductor package can be obtained, for example, by mounting a semiconductor chip or the like on the wiring board of the present invention. The present invention also includes a semiconductor package obtained as described above. In the semiconductor package of the present invention, the solder resist layer made of the solder resist material of the present invention is provided on the wiring board. Therefore, the warpage of the semiconductor package can be effectively suppressed. When using the solder resist material of the present invention, it can meet a requirement for reduction in size and thickness of the semiconductor package and higher level of integration.

Hereinafter, the present invention will be described in detail by way of the Examples and Comparative Examples. However, the present invention is not limited thereto.

EXAMPLES

Raw materials used in the Examples and the Comparative Examples are as follows:

(1) Cyanate resin A/novolac type cyanate resin: "Primaset(R) PT-30" manufactured by Lonza, weight-average molecular weight: 700

(2) Cyanate resin B/novolac type cyanate resin: "Primaset(R) PT-60" manufactured by Lonza, weight-average molecular weight: 2600

(3) Epoxy resin A/biphenyl dimethylene type epoxy resin: "NC-3000" manufactured by Nippon Kayaku Co., Ltd., epoxy equivalent: 275, weight-average molecular weight: 2000

(4) Epoxy resin B/brominated epoxy resin: "Ep5048" manufactured by Japan Epoxy Resins Co., Ltd., epoxy equivalent: 675

(5) Phenoxy resin A/copolymer of biphenyl epoxy resin and bisphenol S epoxy resin whose terminal portion has an epoxy group: "YX-8100H30" manufactured by Japan Epoxy Resins Co., Ltd., weight-average molecular weight: 30000

(6) Phenoxy resin B/copolymer of bisphenol A type epoxy resin and bisphenol F type epoxy resin whose terminal portion has an epoxy group: "Epikote 4275" manufactured by Japan Epoxy Resins Co., Ltd., weight-average molecular weight: 60000

(7) Curing catalyst A/imidazole compound: "2-phenyl-4,5-dihydroxymethylimidazole" manufactured by Shikoku Chemicals Corporation (8) Curing catalyst B/imidazole compound: "2-ethyl-4-methylimidazole" manufactured by Shikoku Chemicals Corporation (9) Inorganic filler/spherical molten silica: "SO-25H" manufactured by Admatechs Co., Ltd., average particle diameter: 0.5 μm

(10) Coupling agent/epoxysilane coupling agent: "A-187" manufactured by Nippon Unicar Co., Ltd.

(11) Coloring agent/mixture of phthalocyanine blue/benzimidazolone/methyl ethyl ketone (=1/1/8): manufactured by Sanyo Color Works, Ltd.

Example 1

25 parts by weight of cyanate resin, 25 parts by weight of epoxy resin A, 10 parts by weight of phenoxy resin A, and 0.4 parts by weight of curing catalyst A were dissolved and dispersed in methyl ethyl ketone. To the mixture, 39 parts by weight of inorganic filler, 0.2 parts by weight of coupling agent, and 0.4 parts by weight of coloring agent were further added, and the obtained mixture was stirred for 10 minutes using a high-speed stirring apparatus to prepare a resin composition varnish 1 having the solid content of 50 wt %. The obtained resin composition varnish 1 was applied to a PET film as a base material (application thickness: 10 μm). It was subjected to heat treatment at 150° C. for 10 minutes, the solvent was removed therefrom for solidification, and thus a resin composition was obtained.

A glass nonwoven fabric (average fiber diameter: 7 μm, maximum fiber length: 10 mm, thickness: 14 μm, basis weight: 15 g/m$^2$, EPC4015 manufactured by Japan Vilene Company), which was treated with epoxysilane, was sandwiched between 2 layers of the obtained resin composition, and pressure of 0.6 MPa was applied thereto at 100° C. under reduced pressure for about 180 seconds using a vacuum pressure type laminator (MVLP-500IIA manufactured by Meiki Co., Ltd.) to obtain a solder resist material having the thickness described in Table 1. The obtained solder resist material was evaluated according to the evaluation method described below.

Example 2

15 parts by weight of cyanate resin A, 10 parts by weight of cyanate resin B, 25 parts by weight of epoxy resin A, 10 parts by weight of phenoxy resin A, and 0.4 parts by weight of curing catalyst A were dissolved and dispersed in methyl ethyl ketone. To the mixture, 39 parts by weight of inorganic filler, 0.2 parts by weight of coupling agent, and 0.4 parts by weight of coloring agent were further added, and the obtained mixture was stirred for 10 minutes using the high-speed stirring apparatus to prepare a resin composition varnish 2 having the solid content of 50 wt %. A solder resist material was obtained in a manner similar to that in Example 1 except for the above-described process, and evaluation thereof was made.

Example 3

30 parts by weight of cyanate resin A, 15 parts by weight of epoxy resin A, 10 parts by weight of phenoxy resin A, 5 parts by weight of phenoxy resin B, and 0.4 parts by weight of curing catalyst A were dissolved and dispersed in methyl ethyl ketone. To the mixture, 39 parts by weight of inorganic filler, 0.2 parts by weight of coupling agent and 0.4 parts by weight of coloring agent were further added, and the obtained mixture was stirred for 10 minutes using the high-speed stirring apparatus to prepare a resin composition varnish 3 having the solid content of 50 wt %. A solder resist material was obtained in a manner similar to that in Example 1 except that the resin composition varnish 1 used in Example 1 was replaced by the resin composition varnish 3, and evaluation thereof was made.

Example 4

30 parts by weight of cyanate resin A, 10 parts by weight of cyanate resin B, 20 parts by weight of epoxy resin A, 5 parts by weight of phenoxy resin A, 5 parts by weight of phenoxy resin B, and 0.4 parts by weight of curing catalyst A were dissolved and dispersed in methyl ethyl ketone. To the mixture, 29 parts by weight of inorganic filler, 0.2 parts by weight of coupling agent and 0.4 parts by weight of coloring agent were further added, and the obtained mixture was stirred for 10 minutes using the high-speed stirring apparatus to prepare a resin composition varnish 4 having the solid content of 50 wt %. A solder resist material was obtained in a manner similar to that in Example 1 except that the resin composition varnish 1 used in Example 1 was replaced by the resin composition varnish 4, and evaluation thereof was made.

Example 5

25 parts by weight of cyanate resin A, 25 parts by weight of epoxy resin A, 10 parts by weight of phenoxy resin A, and 0.2 parts by weight of curing catalyst B were dissolved and dispersed in methyl ethyl ketone. To the mixture, 39 parts by weight of inorganic filler, 0.2 parts by weight of coupling agent and 0.4 parts by weight of coloring agent were further added, and the obtained mixture was stirred for 10 minutes using the high-speed stirring apparatus to prepare a resin composition varnish 5 having the solid content of 50 wt %. The obtained resin composition varnish 5 was applied to a PET film as a base material (application thickness: predetermined). It was subjected to heat treatment at 150° C. for 5 minutes, the solvent was removed therefrom for solidification, and thus a resin composition having the thickness of 16.5 µm was obtained.

A glass woven fabric (cloth type: #1015, width: 360 mm, thickness: 15 µm, basis weight: 17 g/m$^2$), as a fiber base material, was sandwiched between 2 layers of the obtained resin composition, and pressure of 0.6 MPa was applied thereto at 100° C. under reduced pressure for about 180 seconds using the vacuum pressure type laminator (MVLP-500IIA manufactured by Meiki Co., Ltd.) to obtain a solder resist material having the thickness described in Table 2. The obtained solder resist material was evaluated according to the evaluation method similar to that in Example 1.

Example 6

60 parts by weight of epoxy resin B, 2 parts by weight of dicyandiamide as a curing agent, and 0.1 parts by weight of curing catalyst B were dissolved in 100 parts by weight of methyl ethyl cellosolve, and 38 parts by weight of inorganic filler is further added thereto. The obtained mixture was stirred for 10 minutes using the high-speed stirring apparatus to obtain a filler resin composition varnish 6. A solder resist material having the thickness described in Table 2 was obtained in a manner similar to that in Example 5 except that the resin composition varnish 5 used in Example 5 was replaced by the resin composition varnish 6, and evaluation thereof was made.

Example 7

25 parts by weight of cyanate resin A, 25 parts by weight of epoxy resin A, 10 parts by weight of phenoxy resin A, and 0.2 parts by weight of curing catalyst B were dissolved and dispersed in methyl ethyl ketone. To the mixture, 39 parts by weight of inorganic filler, 0.2 parts by weight of coupling agent and 0.4 parts by weight of coloring agent were further added, and the obtained mixture was stirred for 10 minutes using the high-speed stirring apparatus to prepare a resin composition varnish 7 having the solid content of 50 wt %. A solder resist material having the thickness described in Table 2 was obtained in a manner similar to that in Example 5 except that the resin composition varnish 5 used in Example 5 was replaced by the resin composition varnish 7, and evaluation thereof was made.

Example 8

25 parts by weight of cyanate resin A, 25 parts by weight of epoxy resin A, 10 parts by weight of phenoxy resin A, and 0.2 parts by weight of curing catalyst B were dissolved and dispersed in methyl ethyl ketone. To the mixture, 39 parts by weight of inorganic filler, 0.2 parts by weight of coupling agent and 0.4 parts by weight of coloring agent were further added, and the obtained mixture was stirred for 10 minutes using the high-speed stirring apparatus to prepare a resin composition varnish 8 having the solid content of 50 wt %. A solder resist material having the thickness described in Table 2 was obtained in a manner similar to that in Example 5 except that the resin composition varnish 5 used in Example 5 was replaced by the resin composition varnish 8, and evaluation thereof was made.

Example 9

25 parts by weight of cyanate resin A, 25 parts by weight of epoxy resin A, 10 parts by weight of phenoxy resin A, and 0.2 parts by weight of curing catalyst B were dissolved and dispersed in methyl ethyl ketone. To the mixture, 39 parts by weight of inorganic filler, 0.2 parts by weight of coupling agent and 0.4 parts by weight of coloring agent were further added, and the obtained mixture was stirred for 10 minutes using the high-speed stirring apparatus to prepare a resin composition varnish 9 having the solid content of 50 wt %. A solder resist material having the thickness described in Table 2 was obtained in a manner similar to that in Example 5 except that the resin composition varnish 5 used in Example 5 was replaced by the resin composition varnish 9, and evaluation thereof was made.

Example 10

A resin composition varnish 10 having the solid content of 50 wt % was prepared in a manner similar to that in Example 5 except that no coloring agent was blended therein. A solder resist material having the thickness described in Table 2 was obtained in a manner similar to that in Example 5 except that the resin composition varnish 5 used in Example 5 was replaced by the resin composition varnish 10, and evaluation thereof was made.

Comparative Example 1

The resin composition obtained at the time of preparation in Example 1 (not comprising the glass nonwoven fabric) was used as a solder resist material, and evaluation was made in a manner similar to that in Example 1.

Comparative Example 2

Processes were carried out in a manner similar to that in Example 1 except that a dry film type photosensitive solder resist having a composition in which an acrylic resin is the main structure (PFR800-AUS402 manufactured by Taiyo Ink Mfg. Co., Ltd.) was used as a solder resist material.

Comparative Example 3

Processes were carried out in a manner similar to that in Example 1 except that a dry film type photosensitive solder resist having a composition in which an acrylic resin is the main structure (PFR800-AUS402 manufactured by Taiyo Ink Mfg. Co., Ltd.) was used as a solder resist material.

Hereinafter, evaluation items and methods will be described.

<Glass Transition Temperature and Elastic Modulus>

A 4-layer lamination of the obtained solder resist material was made using a normal pressure laminator to prepare a film having the thickness of 80 μm. It was cured at 200° C. for 1 hour, and a piece was cut therefrom to be used as a test specimen (width: 5 mm, length: 30 mm, thickness: 80 μm).

The dynamic viscoelasticity was measured by elevating temperature at the rate of 3° C./min. and providing a distortion with a frequency of 10 Hz using a dynamic viscoelastic measurement apparatus (DMS6100 manufactured by Seiko Instruments Inc.). The glass transition temperature (Tg) was judged from the peak value of tan δ, and according to the measurement, the elastic modulus at 25° C. was obtained.

<Coefficient of Thermal Expansion>

A 3-layer lamination of the obtained solder resist material was made using the normal pressure laminator to prepare a film. It was cured at 200° C. for 1 hour, and a piece was cut therefrom to be used as a test specimen (width: 3 mm, length: 20 mm). The coefficient of thermal expansion was measured by elevating temperature at the rate of 10° C./min. using TMA (manufactured by TA Instruments). The coefficient of thermal expansion at temperature equal to or lower than Tg (α1) was judged from the average of values at temperatures from 30 to 50° C.

<Flame Retardance>

A copper clad laminate (ELC-4785GS manufactured by Sumitomo Bakelite Co., Ltd., thickness: 800 μm) was subjected to etching treatment to form a conductor circuit pattern. It was further subjected to pretreatments such as degreasing and soft etching and laminated with the obtained solder resist material (20 μm), and it was subjected to heat treatment at 200° C. for 1 hour. Measurement was carried out according to the UL-94 specification and the vertical method.

<Na Ion/Cl Ion Impurities>

The obtained solder resist material was cured at 200° C. for 1 hour and shattered to have a particle size of 250 μm or less by means of frost shattering. 3 g of powder sample, which was precisely weighed, was put into a pressure cooker container, 40 ml of ultrapure water was added thereto, and the container was sealed. The container was shaken by hand for 1 minute to blend the sample and water. The container was put into an oven set at 125° C. and subjected to heat and pressure treatment continuously for 20 hours. After it was allowed to stand to cool to room temperature, the solution inside was centrifuged to produce a test solution. The solution was analyzed according to the ion chromatography method and evaluation was made. Evaluation criteria are as follows:

O: the amount of Na ion and Cl ion impurities was 10 ppm or less

X: the amount of Na ion and Cl ion impurities was more than 10 ppm

These results of the evaluation are shown in Tables 1 and 2.

Example 1A

A copper clad laminate (ELC-4785GS manufactured by Sumitomo Bakelite Co., Ltd., thickness: 100 μm and 400 μm) was subjected to etching treatment to form a conductor circuit pattern. It was further subjected to pretreatments such as degreasing and soft etching, and laminated with the solder resist material obtained in Example 1. After it was subjected to thermal curing treatment at 200° C. for 1 hour, a position corresponding to the circuit pattern was irradiated with laser light using a UV-YAG laser (605LDX manufactured by Mitsubishi) to open a pore having the diameter (land diameter) of 50 μm. After that, it was immersed in a permanganate solution (a chemical for desmear treatment) to remove resin residue (smear) of the pore portion, and further immersed in a mixed solution of Enplate MLB-790 (a solution whose main component is an aqueous solution of hydroxylamine sulfate manufactured by Meltex, Inc.), concentrated sulfuric acid and distilled water at 60 to 65° C. for 5 to 10 minutes to be subjected to neutralization treatment. After that, it was subjected to gold plating treatment or preflux treatment (organic solderability preservative treatment), and a piece (50 mm×50 mm) was cut therefrom to produce a wiring board. A semiconductor chip on which a bump was formed was mounted on the wiring board by means of fusion joint, and it was encapsulated using an encapsulation resin (CRP-4152D1 manufactured by Sumitomo Bakelite Co., Ltd.) to prepare a semiconductor package.

Examples 2A to 10A

A wiring board on which a semiconductor chip was mounted and a semiconductor package were prepared in a manner similar to that in Example 1A except that one of the solder resist materials obtained in Examples 2 to 10 was used instead of the solder resist material obtained in Example 1.

Comparative Examples 1A to 3A

A wiring board on which a semiconductor chip was mounted and a semiconductor package were prepared in a manner similar to that in Example 1A except that one of the solder resist materials obtained in Comparative Examples 1 to 3 was used instead of the solder resist material obtained in Example 1.

The obtained semiconductor packages were evaluated with respect to the warpage of the semiconductor packages, moisture resistance and thermal shock properties using the following methods. In addition, the semiconductor packages obtained in Examples 5A to 10A and Comparative Example 3A were evaluated with respect to circuit embedding ability and via forming ability.

<Warpage of Semiconductor Package>

Regarding the degree of warpage of each of the obtained semiconductor packages, variation in the height direction was measured using a temperature variable laser three-dimensional measuring machine (LS220-MT100MT50 manufactured by Hitachi Technologies and Services, Ltd.), and the largest variation value was regarded as the degree of warpage. The measurement temperature was 25° C. Evaluation Criteria are as follows:

⊚: the value of warpage was 200 μm or less

O: the value of warpage was more than 200 μm and 400 μm or less

Δ: the value of warpage was more than 400 μm and 600 μm or less

X: the value of warpage was more than 600 μm and 800 μm or less

<Moisture Resistance Test>

Regarding the above-described 15 semiconductor packages in which the semiconductor chip was mounted on the wiring board, the presence or absence of a defect of disconnection was determined by applying voltage of 20 V thereto in moisture having 100% relative humidity at 125° C. The presence or absence of defects of the 15 semiconductor packages was confirmed every 100 hours. When the number of defects was less than 8, it was designated as O, and when the number of defects was 8 or more, it was designated as X. When 8 or more defects were generated, the measurement of the sample was stopped.

Regarding defects of disconnection and short circuit, the semiconductor packages were put out from a chamber in moisture having 100% relative humidity at 125° C. every 100 hours, and a pad for measuring conductivity, which was provided to the peripheral portion of the wiring board, was subjected to a conductivity testing machine (HIOKI: X=YC Hightester111 6) to check the presence or absence of a defective junction or disconnection in the circuit. The results are shown in Tables 1 and 2. Judgment criteria are as follows:

O: the number of defects generated 1000 hours later was less than 8

X: the number of defects generated 1000 hours later was 8 or more

<Thermal Shock Properties Test>

10 semiconductor packages, in which a semiconductor chip was mounted on a wiring board, similar to those used in the moisture resistance test, were subjected to drying treatment at 125° C. for 24 hours, and put into a constant temperature and humidity chamber having 60% relative humidity at 85° C. according to the JEDEC LEVEL 2 treatment and thereafter left for 40 hours. After that, they were subjected to IR reflow (in $N_2$ flow) 3 times and put into an apparatus in which a chamber at −55° C. and a chamber at 125° C. are exchanged instantly (THERMAL SHOCK CHAMBER TSA-101S manufactured by ESPEC). One cycle consisted of putting in the chamber at 125° C. for 30 minutes and thereafter putting in the chamber at −55° C. for 30 minutes. Conductivity test and detachment observation were carried out after every 500 cycles to 2000 cycles. In the conductivity test, a pad for measuring conductivity, which was provided to the peripheral portion of the wiring board on which the semiconductor chip was mounted, was subjected to a conductivity testing machine (HIOKI: X=YC Hightester111 6) to check the presence or absence of a defective junction or disconnection in the circuit. In the detachment observation, a detachment or crack on the surface on which the semiconductor chip was mounted was observed using SAT (Scanning Acoustic Tomograph). The results are shown in Tables 1 and 2. Judgment criteria for generation of disconnection in the circuit and the presence or absence of defects such as detachment and crack on the surface on which the semiconductor chip was mounted after 2000 cycles are as follows:

O: no defect was generated after 2000 cycles or more

Δ: defect(s) was generated after 1000 to 1500 cycles

X: defect(s) was generated after less than 1000 cycles

<Circuit Embedding Ability>

Examples 5A to 10A and Comparative Example 3A

A 4-layer multilayer wiring board for insulation reliability test, which has a comb-like pattern having the conductor circuit width of 50 μm and the conductor circuit interval of 50 μm in the inner/outer layers, was prepared. The cross section of the comb-like pattern portion was observed using a microscope to evaluate embedding ability of the resin layer. Evaluation criteria are as follows:

⊚: all the samples had excellent embedding ability

O: the circuit wiring was partly in contact with the glass fiber base material, but there was no practical issue Δ: the circuit wiring was in contact with the glass fiber base material, and therefore it was unsuitable for practical use X: a void or the like was generated since embedding in the resin layer was insufficient Via Forming Ability Examples 5A to 10A Both the surfaces of a core substrate on which a circuit pattern was formed (ELC-4785GS manufactured by Sumitomo Bakelite Co., Ltd., thickness: 0.23 mm) were laminated with the above-described solder resist material (laser type). Next, a resin layer portion of a pad portion was subjected to laser irradiation in order to form a via hole. A CO2 laser (manufactured by Mitsubishi Electric Corporation) was used for laser irradiation, and via holes having various via diameters (100 μm, 80 μm, and 50 μm) were formed. Next, residue of the solder resist material (smear) present in the bottom of the via holes was removed using a chemical for desmear treatment. The obtained via holes were observed using a Scanning Electron Microscope (200× to 1000×) to evaluate via shapes. Evaluation criteria are as follows:

⊚: a good via shape was obtained to the via diameter of 50 μm

O: a good via shape was obtained to the via diameter of 80 μm, but not obtained when the via diameter was 50 μm Δ: a good via shape was obtained to the via diameter of 100 μm, but not obtained when the via diameter was 80 μm Comparative Example 3A Both the surfaces of a core substrate on which a circuit pattern was formed (ELC-4785GS manufactured by Sumitomo Bakelite Co., Ltd., thickness: 0.23 mm) were laminated with the above-described solder resist material (PFR-800 AUS402, thickness: 30 μm, manufactured by Taiyo Ink Mfg. Co., Ltd.). Exposure/development was performed according to the publicly-known method to form via holes having various via diameters (100 μm, 80 μm, and 50 μm). The obtained via holes were observed using a Scanning Electron Microscope (200× to 100×) to evaluate via shapes based on the same evaluation criteria as those in the above-described Examples.

The results of the evaluation are shown in Tables 1 and 2.

TABLE 1

|  |  | Example 1 Example 1A | Example 2 Example 2A | Example 3 Example 3A | Example 4 Example 4A | Comparative Ex. 1 Comparative Ex. 1A | Comparative Ex. 2 Comparative Ex. 2A |
|---|---|---|---|---|---|---|---|
| Presence or absence of uneven distribution of fiber base material-containing layer |  | Absent | Absent | Absent | Absent | — | — |
| Total thickness | μm | 20 | 20 | 20 | 20 | 20 | 20 |
| Fiber base material-containing layer | μm | 14 | 14 | 14 | 14 | — | — |
| First resin layer (B1) | μm | 3 | 3 | 3 | 3 | — | 10 |
| Second resin layer (B2) | μm | 3 | 3 | 3 | 3 | — | 10 |
| Ratio (B2/B1) | — | 1 | 1 | 1 | 1 | — | 1 |
| Glass transition temperature | °C. | 253 | 251 | 252 | 253 | 248 | 115 |
| Elastic modulus | GPa | 12 | 13 | 11 | 12 | 5 | 3 |
| Coefficient of thermal expansion (α1) | ppm | 20 | 20 | 20 | 20 | 29 | 60 |
| Flame retardance | UL-94 | V-0 | V-0 | V-0 | V-0 | V-0 | V-1 |
| Na ion impurities | — | ○ | ○ | ○ | ○ | ○ | X |
| Cl ion impurities | — | ○ | ○ | ○ | ○ | ○ | X |
| Warpage of package | 400 μm core | ◎ | ◎ | ◎ | ◎ | ◎ | ○ |
|  | 100 μm core | ◎ | ◎ | ◎ | ◎ | ◎ | X |
| Moisture resistance | 400 μm core | ○ | ○ | ○ | ○ | ○ | X |
|  | 100 μm core | ○ | ○ | ○ | ○ | X | X |
| Thermal shock properties | 400 μm core | ○ | ○ | ○ | ○ | ○ | X |
|  | 100 μm core | ○ | ○ | ○ | ○ | X | X |

TABLE 2

|  |  | Example 5 Example 5A | Example 6 Example 6A | Example 7 Example 7A | Example 8 Example 8A | Example 9 Example 9A | Example 10 Example 10A | Comparative Ex. 3 Comparative Ex. 3A |
|---|---|---|---|---|---|---|---|---|
| Presence or absence of uneven distribution of fiber base material-containing layer |  | Absent | Present | Present | Present | Present | Absent | — |
| Total thickness | μm | 40 | 35 | 30 | 40 | 35 | 40 | 30 |
| Circuit thickness | μm | 18 | 18 | 18 | 18 | 18 | 18 | 18 |
| Fiber base material-containing layer | μm | 15 | 15 | 15 | 15 | 15 | 15 | — |
| First resin layer (B1) | μm | 12.5 | 16 | 11 | 21 | 16 | 12.5 | — |
| Second resin layer (B2) | μm | 12.5 | 4 | 4 | 4 | 4 | 12.5 | — |
| Ratio (B2/B1) | — | 1 | 0.25 | 0.36 | 0.19 | 0.25 | 1 | — |
| Elastic modulus | GPa | 12 | 13 | 14 | 12 | 13 | 12 | 3.4 |
| Coefficient of thermal expansion (α1) | ppm | 16 | 12 | 8 | 10 | 10 | 16 | 60 |
| Na ion impurities | — | ○ | ○ | ○ | ○ | ○ | ○ | X |
| Cl ion impurities | — | ○ | ○ | ○ | ○ | ○ | ○ | X |
| Warpage of package | 400 μm core | ◎ | ○ | ◎ | ◎ | ◎ | ◎ | X |
|  | 100 μm core | ◎ | ○ | ◎ | ◎ | ◎ | ◎ | X |
| Moisture resistance | 400 μm core | ○ | ○ | ○ | ○ | ○ | ○ | ○ |
|  | 100 μm core | ○ | ○ | ○ | ○ | ○ | ○ | ○ |
| Thermal shock properties | 400 μm core | ○ | ○ | ○ | ○ | ○ | ○ | X |
|  | 100 μm core | ○ | ○ | ○ | ○ | ○ | ○ | X |
| Circuit embedding ability | 400 μm core | ○ | ◎ | ◎ | ◎ | ◎ | ○ | ◎ |
|  | 100 μm core | ○ | ◎ | ◎ | ◎ | ◎ | ○ | ◎ |
| Via forming ability | 400 μm core | ○ | ○ | ○ | ○ | ○ | ○ | Δ |
|  | 100 μm core | ○ | ○ | ○ | ○ | ○ | ○ | Δ |

Based on the results of the evaluation of Examples 1 to 4 (1A to 4A) and Comparative Examples 1 to 2 (1A to 2A), regarding the Examples, the degree of warpage of the package was low; the product had high heat resistance, and was excellent in thermal shock properties because of low coefficient of thermal expansion; and the product was also excellent in moisture resistance. In contrast, regarding Comparative Example 1, the coefficient of thermal expansion was high because of the absence of the glass fiber base material-containing layer; and the product was inferior in moisture resistance and thermal shock properties. Regarding Comparative Example 2, the product was inferior in moisture resistance and thermal shock properties, and it is inferred that this is due to low heat resistance and high coefficient of thermal expansion.

Based on the results of the evaluation of Examples 5 to 10 (5A to 10A) and Comparative Example 3 (3A), regarding the Examples, the degree of warpage of the package was low; and the product was excellent in thermal shock properties and moisture resistance, and also had good circuit embedding ability and via forming ability. It is understood that circuit embedding ability was particularly excellent when the fiber base material-containing layer was unevenly distributed. In contrast, regarding Comparative Example 3, in which no fiber base material-containing layer was contained, the warpage of the package was generated, and the product was inferior in thermal shock properties.

The above-described results show that the solder resist material of the present invention is excellent in thermal shock properties, moisture resistance and the like with a low degree of warpage of package, and can be suitably used in a thin wiring board and a semiconductor package in which a semiconductor chip is mounted on the thin wiring board.

INDUSTRIAL APPLICABILITY

The solder resist material of the present invention is excellent in heat resistance, moisture resistance and thermal shock properties, and has a high elastic modulus and a low coefficient of thermal expansion, and the warpage of a package can be effectively suppressed thereby. Therefore, the solder resist material of the present invention can be used for a solder resist, a sealing material, a molding material, a coating material, an interposer, an interlayer insulation layer for various wiring boards, etc.

The invention claimed is:

1. A solder resist material comprising at least a first resin layer, a second resin layer and a fiber base material-containing layer, wherein the fiber base material-containing layer is interposed between the first resin layer and the second resin layer, wherein the fiber base material-containing layer is unevenly distributed in the thickness direction of the solder resist material.

2. The solder resist material according to claim 1, wherein the ratio between the thickness (B1) of the first resin layer and the thickness (B2) of the second resin layer (B2/B1) satisfies 0<B2/B1<1.

3. The solder resist material according to claim 1, wherein a fiber base material included in the fiber base material-containing layer is selected from a glass fiber base material and an organic fiber base material.

4. The solder resist material according to claim 1, wherein the fiber base material included in the fiber base material-containing layer is a glass fiber base material having a coefficient of thermal expansion (CTE) of 6 ppm or less.

5. The solder resist material according to claim 1, wherein a resin composition constituting the first resin layer and the second resin layer comprises: a cyanate resin and/or a prepolymer thereof; an epoxy resin which does not substantially contain a halogen atom; a phenoxy resin which does not substantially contain a halogen atom; and an imidazole compound.

6. The solder resist material according to claim 1, wherein the amount of Na ion or Cl ion contained in the solder resist material is 10 ppm or less.

7. The solder resist material according to claim 1, wherein the solder resist material further comprises a coloring agent.

8. The solder resist material according to claim 7, wherein the coloring agent is a pigment in which the weight ratio of a halogen-free yellow pigment and/or a halogen-free orange pigment to a halogen-free blue pigment is in the range of 1:10 to 10:1.

9. The solder resist material according to claim 8, wherein the halogen-free yellow pigment is benzimidazolone yellow and the halogen-free blue pigment is copper phthalocyanine blue.

10. A wiring board to which a solder resist layer made of the solder resist material according to claim 1 is provided.

11. The wiring board according to claim 10, wherein a pore portion of the solder resist layer is provided by means of laser irradiation.

12. A semiconductor package having the wiring board according to claim 10.

* * * * *